United States Patent [19]

Hamakawa et al.

[11] 4,410,559

[45] Oct. 18, 1983

[54] METHOD OF FORMING AMORPHOUS SILICON FILMS

[76] Inventors: Yoshihiro Hamakawa, 3-17-4, Minami-Hanayashiki, Kawanishi, Hyogo; Yoshihisa Tawada, 14-39, Oike-Miyamadai, Kita-ku, Kobe, Hyogo, both of Japan

[21] Appl. No.: 316,422

[22] Filed: Oct. 29, 1981

[30] Foreign Application Priority Data

Oct. 31, 1980 [JP] Japan ................................ 55-154475

[51] Int. Cl.³ .................... C23C 11/00; H01L 31/18
[52] U.S. Cl. .................................. 427/39; 136/258; 357/2; 357/30; 427/74; 427/86
[58] Field of Search ............................ 427/39, 74, 86; 136/258 AM; 357/2, 30

[56] References Cited

U.S. PATENT DOCUMENTS 4,064,521 12/1977 Carlson .................................. 357/2

OTHER PUBLICATIONS

D. E. Carlson, "Recent Developments in Amorphous Silicon Solar Cells", *Solar Energy Materials*, vol. 3, pp. 503-518, (1980).

*Primary Examiner*—Aaron Weisstuch
*Attorney, Agent, or Firm*—Wenderoth, Lind & Ponack

[57] ABSTRACT

In a method of forming a layer of an amorphous silicon compound by subjecting a gas containing a silane compound to glow discharge decomposition, the improvement wherein the substrate on which the amorphous silicon compound is to be deposited is positioned within 3 cm above or below the end of a positive column formed by said glow discharge.

9 Claims, 5 Drawing Figures

FIG. I

SHORTEST DISTANCE L BETWEEN THE ELECTRODE
AND THE SUBSTRATE (cm)

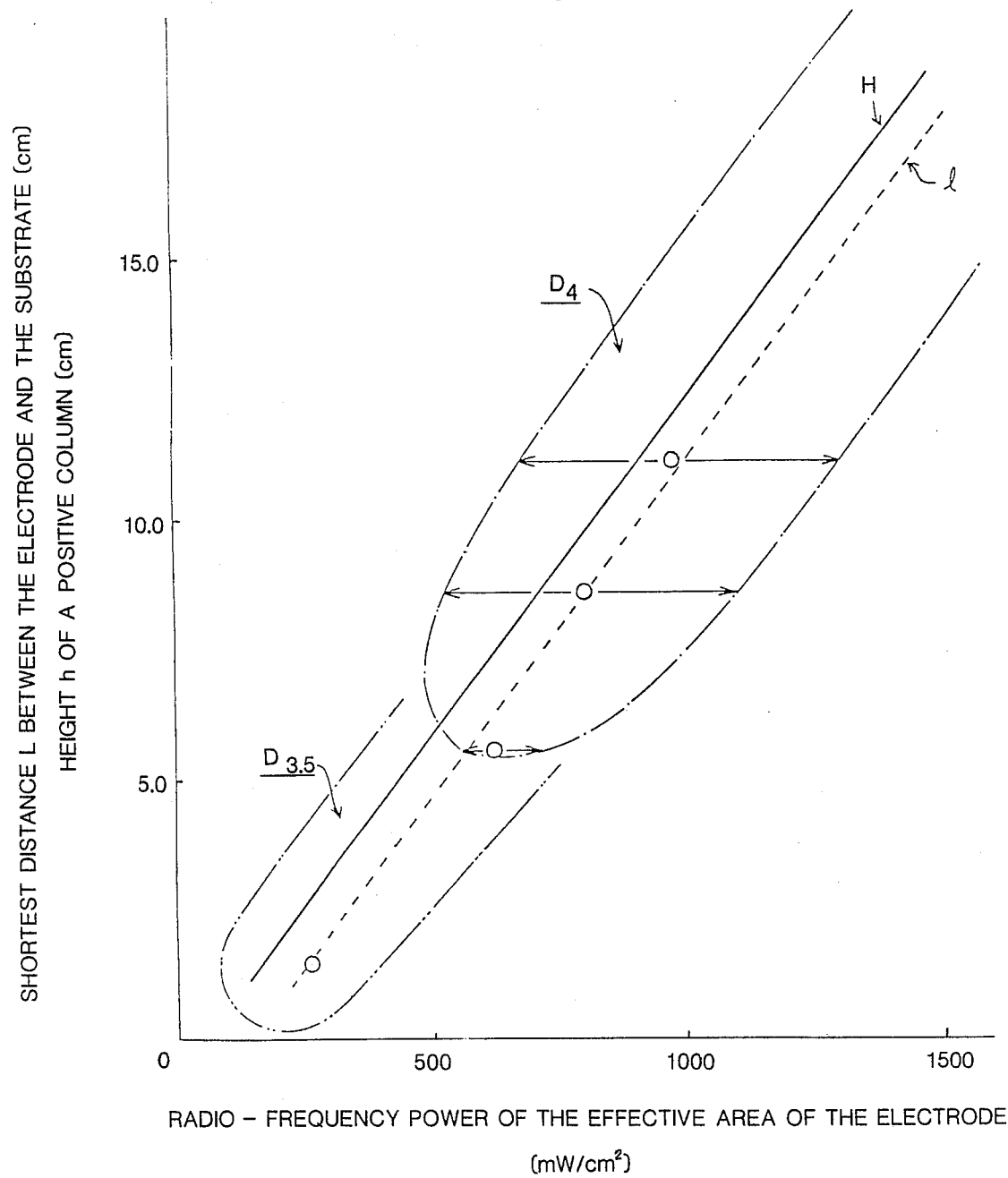

METHOD OF FORMING AMORPHOUS SILICON FILMS

BACKGROUND OF THE INVENTION

1. Field of the Invention:

This invention relates to a method of manufacturing amorphous silicon compounds.

2. Description of the Prior Art:

W. E. Spear et al. discovered in 1976 that the conductivity of amorphous silicon obtained by the plasma decomposition of silane ($SiH_4$) could be notably improved by substitutional doping with $PH_3$ or $B_2H_6$. D. E. Carlson et al. manufactured a trial solar cell using amorphous silicon in 1976. These achievements have drawn attention to amorphous silicon, and have given an impetus to researches devoted to improvement of the conversion efficiency of a thin-film solar cell using amorphous silicon.

The researches so far have led to the conclusion that an appropriate thin-film amorphous silicon photovoltaic cell is of the Schottky barrier type, p-i-n type, MIS type, or heterojunction type. Particularly, the first three types promise to provide highly efficient solar cells. The Schottky barrier type photovoltaic cell made by D. E. Carlson et al. in 1977 showed a conversion efficiency of 5.5%, the MIS type photovoltaic cell made by J. I. B. Wilson et al. in 1978 showed a conversion efficiency of 4.8%, and the pin type photovoltaic cell made by Yoshihiro Hamakawa in 1979 showed a conversion efficiency of 4.5%.

In a thin-film amorphous silicon solar cell, a carrier has a short life time in a p or n type doped layer, and a relatively long life time in an intrinsic amorphous silicon layer. It is, therefore, considered that in order to increase the efficiency of a thin-film amorphous silicon solar cell, it is important to improve the properties of its intrinsic amorphous silicon layer.

J. C. Knights and K. Tanaka examined the relationship between the magnitude of radio-frequency power as required for the plasma decomposition of silane, and the physical properties of intrinsic amorphous silicon thereby obtained. They both reported the advisability of employing a lower radio-frequency power. See Supplement to *Japanese Journal of Applied Physics*, Vol. 18-1, 101 (1979), and *Journal of Non-Crystalline Solids*, Vols. 35 and 36, 475 (1980), respectively.

The inventors of this invention have conducted extensive research and experiments for improving the conversion efficiency of a thin-film amorphous silicon solar cell. As a result, they have discovered that the optimum radio-frequency power for improving the conversion efficiency of such a solar cell is not always low as reported by J. C. Knights and K. Tanaka, but depends on the distance L between the radio-frequency electrode (cathode) for glow discharge and the solar cell substrate. This discovery has led to the conclusion that the conversion efficiency of a solar cell can be maximized if the distance L between the radio-frequency electrode and the cell substrate is appropriately selected, and that amorphous silicon of improved performance can be obtained if the substrate on which amorphous silicon is deposited is positioned in the vicinity of the end of a positive column formed by glow discharge.

SUMMARY OF THE INVENTION

According to this invention, there is provided a method of manufacturing an amorphous silicon film be decomposing a gas containing a silane compound in a glow discharge, characterized in that the substrate on which the amorphous silicon film is deposited is positioned within a distance of 3 cm above or below (hereinafter plus or minus 3 cm) the end of a positive column formed by the glow discharge.

BRIEF DESCRIPTION OF THE DRAWINGS

FIG. 5 is a graph showing the relationship between the end of the positive glow discharge column and the optimum or suitable substrate position.

DETAILED DESCRIPTION OF THE INVENTION

A known method of manufacturing amorphous silicon comprises subjecting to radio-frequency or DC glow discharge decomposition by the capacitive or inductive coupling method, silane ($SiH_4$) or a derivative thereof ($Si_nH_{2n+2}$), or silane fluoride ($SiF_4$) or a derivative thereof ($Si_nF_mH_{2n+2-m}$), which will hereinafter be called a silane compound, a mixed gas consisting of a silane compound and at least one of a saturated or unsaturated aliphatic hydrocarbon and a fluorine derivative thereof, which will hereinafter be called a carbon compound, a mixed gas consisting of a silane compound, and at least one of nitrogen, ammonia and hydrazine, which will hereinafter be called a nitrogen compound, or a mixed gas consisting of a silane compound, a carbon compound and a nitrogen compound. This invention provides an improvement in the known method.

Figure 1:
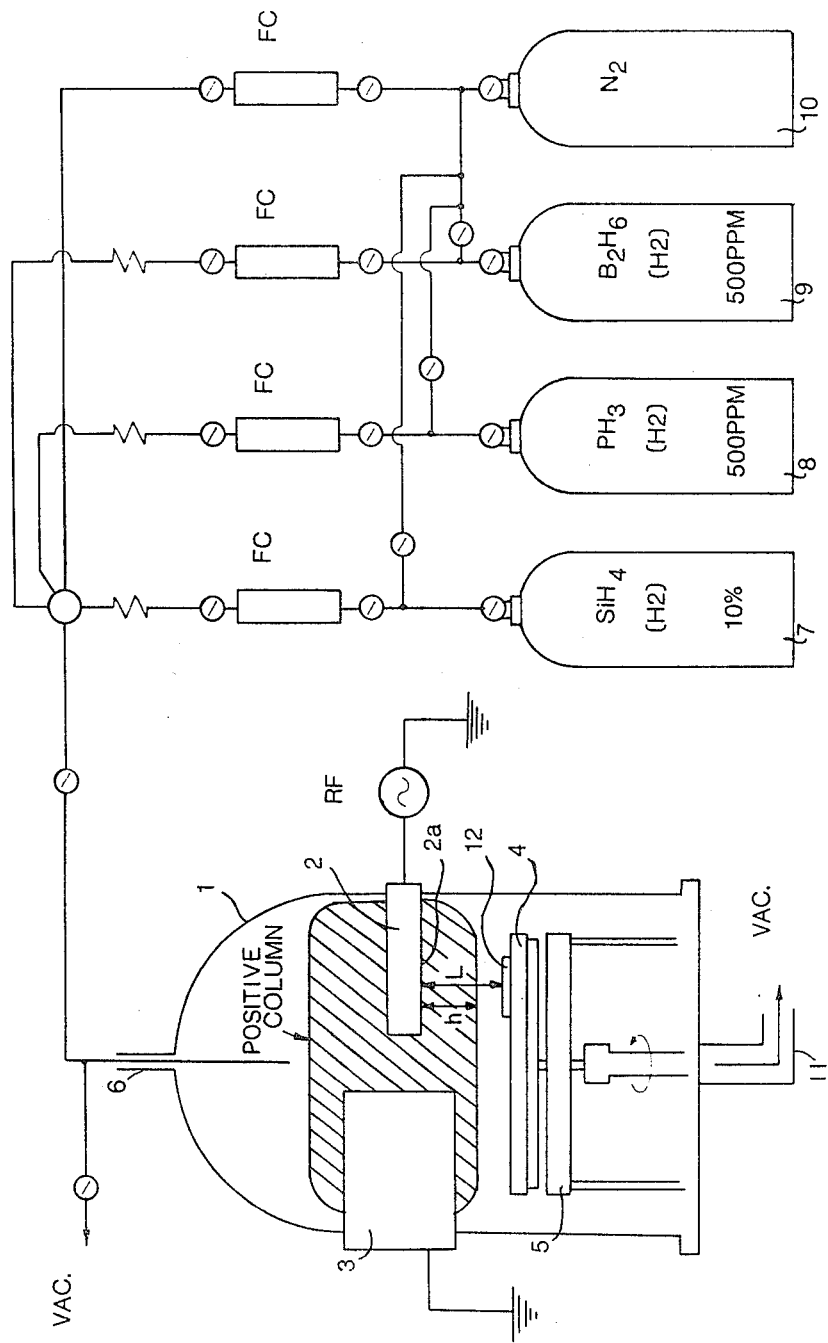
FIG. 1 is a diagrammatical side elevation of an example of the apparatus which may be used for carrying out the method of this invention.

The method of this invention can be carried out by employing an apparatus as shown by way of example in FIG. 1. A reactor 1 in which glow discharge is caused to take place has an inside diameter of 11 cm, and is made of glass or quartz. An electrode 2 (cathode) for a radio-frequency output having an effective area of 55.5 $cm^2$, and an opposite electrode 3 (anode) connected to ground are disposed on the outside or inside of the reactor 1. A susceptor 4 is rotatably supported on a shaft. A heater 5 is mounted below the susceptor 4. The reactor 1 has a gas inlet 6 through which a mixed gas obtained by mixing appropriate gases from bottles 7 to 10 is introduced into the reactor 1. The reactor 1 also has an evacuation outlet 11 connected to an evacuation pump (not shown). A substrate 12, which is formed from glass, a film of a high molecular weight substance, a metal plate, or the like, and on which a transparent electrode of $SnO_2$, ITO (indium tin oxide), or like material is formed by evaporation, is placed on the susceptor 4. The substrate 12 is heated to a temperature of 200° C. to 300° C. by the heater 5. The reactor 1 is evacuated to a vacuum of $10^{-2}$ Torr, or a lower pressure. A mixed gas is obtained by appropriately mixing gases from the bottles 7 to 10, and introduced into the reactor 1.

A pressure of, say, 0.1 to 10 Torr is maintained in the reactor 1, and the mixed gas is subjected to radio-frequency glow discharge, whereby a thin-film amorphous silicon solar cell of any desired construction is obtained.

According to the method of this invention, it is possible to manufacture a thin-film solar cell of any type including as an active layer an i layer of intrinsic amorphous silicon having a carrier lifetime of, say, at least $10^{-7}$ sec., a localized density of states not higher than, say, $10^{17}$ cm$^{-3}$eV$^{-1}$ and a mobility of at least $10^{-3}$ cm$^2$/V. For example, the solar cell may comprise Pt-i-n stainless steel (Schottky barrier type), Pt-thin insulating layer-n-stainless steel (MIS type), glass-transparent electrode-p-i-n-Al (pin type), or transparent electrode-n-i-p-stainless steel (pin type), wherein i stands for intrinsic amorphous silicon, p stands for a p type amorphous silicon compound formed by doping with boron, or any other element of Group III of the periodic table, and n stands for an n type amorphous silicon compound formed by doping with phosphorus, or any other element of Group V of the periodic table. It is preferable that the i and p layers have a thickness of, say, 1500 to 10,000 Å, and 40 to 150 Å, respectively. The n layer, of which the primary function is to establish ohmic contact, does not have any thickness limitation, but it would usually be suitable to form it with a thickness of, say, 300 to 800 Å.

The inventors conducted the glow discharge decomposition of a silane compound by employing the apparatus shown in FIG. 1, varying the position of the high-frequency electrode 2, and applying a high frequency of 13.56 MHz thereto. The bottles 7 to 10 were filled with a mixture of SiH$_4$ and hydrogen containing 10 mol % of SiH$_4$, a mixture of PH$_3$ and hydrogen containing 500 ppm of PH$_3$, a mixture of B$_2$H$_6$ and hydrogen containing 500 ppm of B$_2$H$_6$, and N$_2$, respectively. A 2 cm square glass substrate 12, on which a film of SnO$_2$ having a thickness of about 1000 Å had been formed by vacuum deposition, was placed on the susceptor 4. After the internal pressure of the reactor 1 had been lowered to $10^{-3}$ Torr by a rotary pump (not shown), the substrate 12 was heated to 250° C. by the heater 5. Then, a mixed gas composed of SiH$_4$ and B$_2$H$_6$ was introduced into the reactor 1 through gas inlet 6, and subjected to glow discharge decomposition, whereby a p layer doped with 0.2 mol % of B$_2$H$_6$, and having a thickness of about 100 Å was formed on the SnO$_2$ layer on the glass substrate 12. Then, SiH$_4$ was introduced to form an i layer having a thickness of 6000 Å, SiH$_4$ and PH$_3$ to form an n layer doped with 0.5 mol % of PH$_3$, and having a thickness of about 500 Å, and finally, a 3.3 mm$^2$ aluminum electrode was formed on the n layer by vacuum deposition. A plurality of thus described thin-film solar cells were prepared.

A first group of thin-film solar cells (Group A) were manufactured by positioning the radio-frequency electrode 2 at a level at which the shortest distance L between the lower surface 2a of the electrode 2 and the upper surface of the substrate 12 on the susceptor 4 was 1.5 cm. The distance L was increased for the manufacture of the second to fourth groups of cells (Groups B to D), and was 5.5 cm for Group B, 8.5 cm for Group C, and 11.0 cm for Group D.

Figure 2:
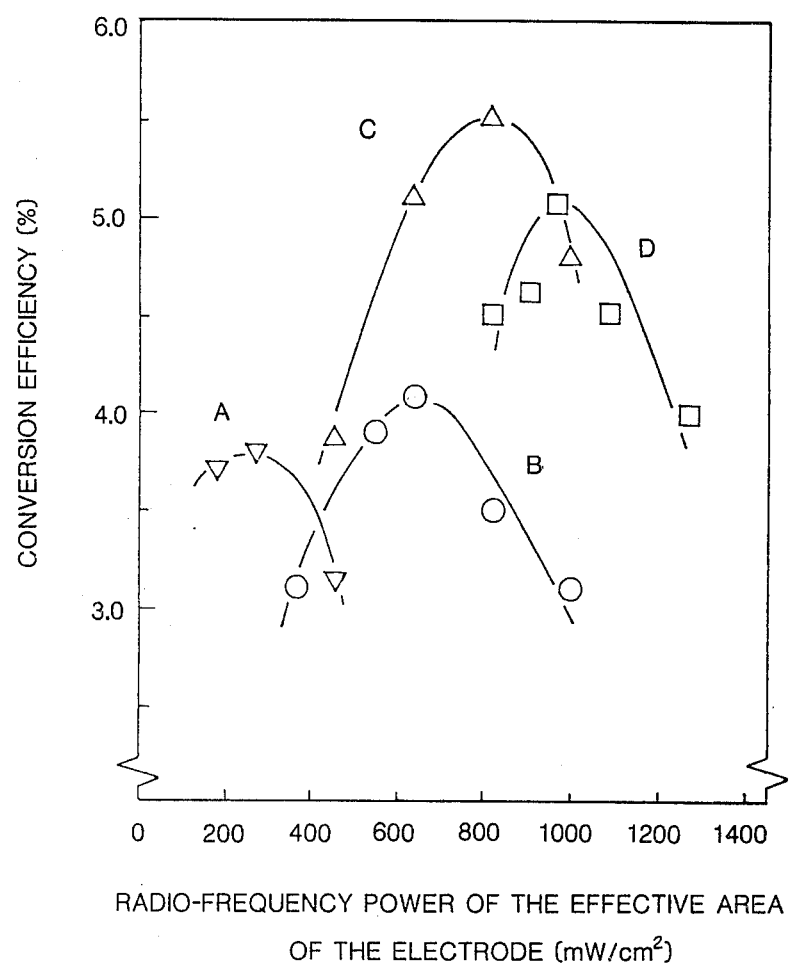
FIG. 2 is a graph showing the relationship between the radio-frequency power required for the formation of an i-layer and the power conversion efficiency of Groups A to D of thin-layer solar cells.

The high- or radio-frequency power applied to the electrode 2 for forming the p layer was 216 mW/cm$^2$ of the effective area of the electrode for Group A, 450 mW/cm$^2$ for Group B, 631 mW/cm$^2$ for Group C, and 811 mW/cm$^2$ for Group D. The radio-frequency power applied for forming the i and n layers was varied in the range of 180 mW to 1200 mW per cm$^2$ of the effective area of the electrode for all of Groups A to D, so that it might be possible to determine what the optimum radio-frequency power would be for each Group. For the purpose of this determination, AM-1 rays were radiated at a rate of 100 mW/cm$^2$ on each of Groups A to D solar cells prepared by applying different amounts of radio-frequency power during the formation of the i layer as stated above, and the power conversion efficiencies were measured. The results are shown in FIG. 2. As is obvious from FIG. 2, the optimum radio-frequency power at which the maximum conversion efficiency was obtained differed from one group to another. As hereinbefore referred to, J. C. Knights and K. Tanaka reported that the lower the radio-frequency power for glow discharge, the better would be the properties of the intrinsic amorphous silicon. According to this invention, however, it has been ascertained that the optimum radio-frequency power which will maximize the conversion efficiency of a thin-film solar cell having a layer of intrinsic amorphous silicon as an active layer depends on the position of the radio-frequency glow discharge electrode.

Figure 3:
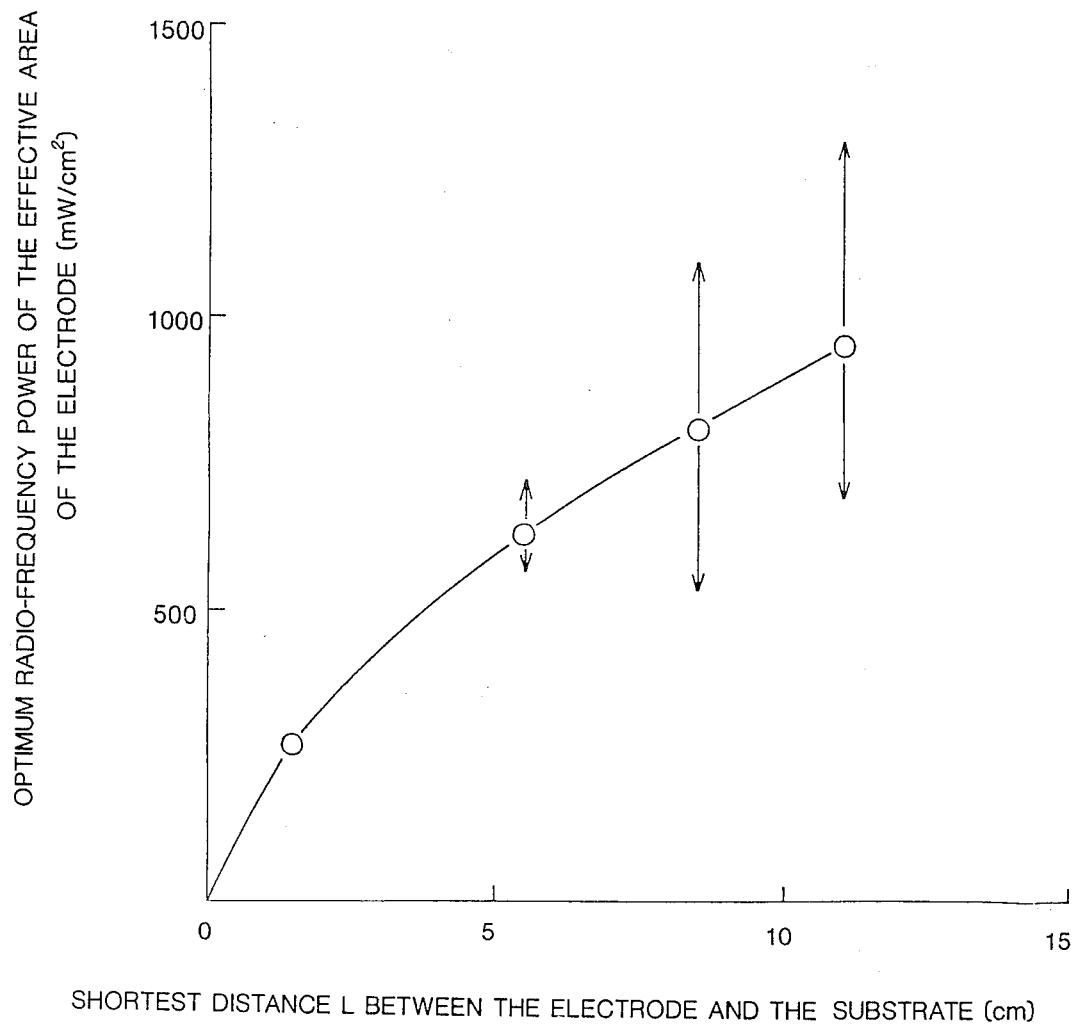
FIG. 3 is a graph showing the relationship between the distance L and the optimum or suitable radio-frequency power.

The curve in FIG. 3 shows the relationship between the shortest distance L between the radio-frequency electrode and the substrate, and the optimum radio-frequency power which depends on the distance L. In FIG. 3, each arrow line indicates the range of the radio-frequency power applied for forming the i layer on any of the thin-film solar cells which showed a conversion efficiency of at least 4%. As is obvious from the curve, the optimum radio-frequency power is substantially proportional to the distance L if the distance L is greater than about 1.5 cm. This is a fact which could never be expected from the results of the past researches in the art.

Figure 4:
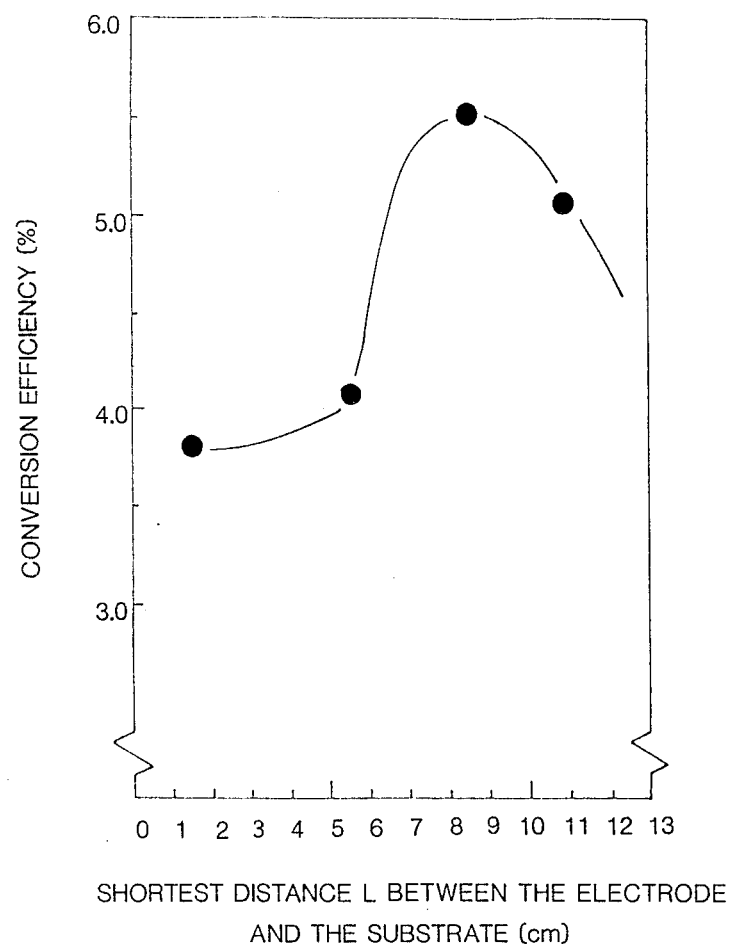
FIG. 4 is a graph showing the relationship between the distance L and the maximum conversion effciency.

FIG. 4 shows, in relation to the distance L, the maximum conversion efficiency obtained for each group of solar cells when the optimum radio-frequency power was applied for forming the i layer. As is obvious from the curve, the conversion efficiency shows a sharp increase if the distance L exceeds about 5.0 cm, reaches a maximum value when the distance L is about 8.5 cm, and decreases if it exceeds 11 cm. It has also been found that a conversion efficiency of about 4% can be maintained until the distance L reaches about 20 cm.

As is obvious from the foregoing description, this invention makes it possible to manufacture a thin-film solar cell having a high conversion efficiency of at least 4%, and including a layer of intrinsic amorphous silicon formed by glow discharge decomposition at a radio-frequency power of 500 to 1200 mW, or preferably 600 to 1100 mW, applied per cm$^2$ of the effective area of an electrode so positioned that the distance L may be in the range of 5 to 20 cm. According to a salient feature of this invention, during the formation of any such layer of intrinsic amorphous silicon, the cell substrate is not positioned in the center of a positive column formed by radio-frequency glow discharge, but in the vicinity of its end.

The height h of a positive column was examined by subjecting a mixed gas containing silane to glow discharge at different levels of radio-frequency power in the reactor 1 of FIG. 1 from which the susceptor 4 and the heater 5 had been removed. The height h was determined as the distance between the lower surface 2a of the electrode 2 and the lower end of the positive column. The results are shown by solid line H in FIG. 5. The height h of the positive column shows a substantially linear increase with an increase in radio-frequency power. Broken line l in FIG. 5 was obtained by plotting the optimum high-frequency power at which each of Groups A to D of solar cells had shown the maximum conversion efficiency. The broken line 1 indicates a position spaced inwardly of the lower end of the positive column by about 1.0 cm at a given level of radio-frequency power, and suggests that it is possible to obtain amorphous silicon of the best quality by decomposing a silane compound if the substrate is located in such a position.

A domain $D_4$ defined by the one-dot chain line in FIG. 5 represents the electrode position and the radio-frequency power which enable a conversion efficiency of at least 4%. The domain $D_4$ defines the substrate position at which a conversion efficiency of at least 4% can always be obtained. It is thus obvious that in order to manufacture amorphous silicon which enables a conversion efficiency of at least 4%, it is necessary to ensure that the positive column formed by glow discharge have a height h of at least 6 cm, and that the substrate be positioned within plus or minus 3 cm from the end of the positive column. The inventors have also experimentally discovered that even if the height h of the positive column is less than 6 cm, a conversion efficiency of at least 3.5% can be obtained if the substrate is positioned within a domain $D_{3.5}$ defined by the two-dot chain line in FIG. 5. Accordingly, it is always possible to obtain good amorphous silicon having a high carrier mobility and lifetime if, according to this invention, a silane compound is subjected to plasma decomposition with the substrate positioned within plus or minus 3 cm from the end of the positive column (domains $D_{3.5}$ and $D_4$). Therefore, the method of this invention is also highly advantageous for the manufacture of amorphous silicon which will be used in any other semiconductor element.

Although the foregoing description has referred to the example in which the positive column is formed by radio-frequency glow discharge in accordance with the capacitive coupling method, it is possible to employ any other method for forming a plasma, and obtain amorphous silicon having excellent properties if the substrate is positioned within plus or minus 3 cm from the end of the positive column. In other words, the method of this invention is equally applicable to the decomposition of a silane compound by a plasma, whether the plasma may be formed by radio-frequency glow discharge according to the inductive coupling method, by DC glow discharge, or by a combination thereof. Moreover, this invention is, of course, applicable to the decomposition of a silane compound which is performed under varying conditions of a plasma while an electric or magnetic field is being applied thereto.

The method of this invention is not only useful for the manufacture of amorphous silicon per se, but is also effective for the manufacture of amorphous silicon compounds. In the claims, "amorphous silicon compound" is intended to include both amorphous silicon itself and compounds thereof, for example, amorphous silicon carbide obtained by the decomposition of a silane compound doped with an element of Group III or V of the periodic table, and a carbon compound, amorphous silicon nitride obtained by the decomposition of such a silane compound and a nitrogen compound, and amorphous silicon carbonitride obtained by the decomposition of the aforesaid silane, carbon and nitrogen compounds. A heterojunction solar cell obtained by incorporating as at least one of the p and n layers of a pin junction cell an amorphous silicon compound manufactured in accordance with the method of this invention showed a conversion efficiency of at least 8%. More specifically, a mixed gas consisting of silane, methane and diborane ($B_2H_6$), which were supplied at flow rates of 30 cc/min., 70 cc/min. and 10 cc/min., respectively, was subjected to glow discharge by application of a radio-frequency power of 800 mW/cm$^2$, whereby a layer of p type amorphous silicon carbide having a thickness of 100 Å was deposited on a 2 cm square glass substrate on which $SnO_2$ had been deposited by evaporation, and which had been positioned at a distance L of 9 cm. Then, silane was subjected to glow discharge decomposition to form a layer of intrinsic amorphous silicon having a thickness of 6500 Å, followed by glow discharge decomposition of phosphine ($PH_3$) at a flow rate of 40 cc/min. and silane at a flow rate of 40 cc/min., thereby forming a layer of n type amorphous silicon, whereby a pin type solar cell was prepared. This solar cell showed excellent properties, i.e., a short-circuit current (Jsc) of 15.2 mA/cm$^2$, an open circuit voltage (Voc) of 0.88 V, a fill factor (FF) of 60%, and a conversion efficiency ($\eta$) of 8.0%.

What is claimed is:

1. In a method of forming a layer of an amorphous silicon compound on a top surface of a substrate by subjecting a gas containing a silane compound to glow discharge decomposition in the presence of said substrate in an apparatus comprising an anode and a cathode, the improvement wherein said anode and said cathode are positioned such that a line extending through both said anode and said cathode is at a right angle to a line extending perpendicularly from said top surface of said substrate, and said top surface of said substrate is positioned within 3 cm from the lower end of a positive column formed by glow discharge, said 3 cm being the distance between said top surface of said substrate and said lower end of said positive column, said distance being measured perpendicular to said top surface of said substrate.

2. A method as set forth in claim 1, wherein said glow discharge decomposition is performed by a method selected from the group consisting of radio-frequency glow discharge decomposition by the electrostatic capacitive coupling method, radio-frequency glow discharge decomposition by the inductive coupling method, DC glow discharge decomposition, and a combination thereof.

3. A method as set forth in claim 1 or 2, wherein said substrate is a substrate for a thin-film amorphous silicon solar cell.

4. A method as set forth in claim 1 or 2, wherein said amorphous silicon compound is formed as a layer of intrinsic amorphous silicon for one of the Schottky barrier type, MIS type, and P-I-N type thin-film amorphous silicon solar cells.

5. A method as set forth in claim 4, wherein said layer of intrinsic amorphous silicon is formed on said substrate as a thin film having a thickness of 1500 to 10,000 Å.

6. A method as set forth in claim 1 or 2, wherein said gas contains a doping element selected from the group consisting of the elements belonging to Groups III and V of the periodic table.

7. A method as set forth in claim 1 or 2, wherein said gas is a mixture containing (1) at least one of $SiH_4$, $Si_nH_{2n+2}$, $SiF_4$ and $Si_nF_mH_{2n+2-m}$, and (2) at least one of saturated and unsaturated aliphatic hydrocarbons and their fluorine derivatives.

8. A method as set forth in claim 1 or 2, wherein said gas is a mixture containing (1) at least one of $SiH_4$, $Si_nH_{2n+2}$, $SiF_4$ and $Si_nF_mH_{2n+2-m}$, and (2) at least one of nitrogen, ammonia and hydrazine.

9. A method as set forth in claim 1 or 2, wherein said gas is a mixture containing (1) at least one of $SiH_4$, $Si_nH_{2n+2}$, $SiF_4$ and $Si_nF_mH_{2n+2-m}$, (2) at least one of saturated and unsaturated aliphatic hydrocarbons and their fluorine derivatives, and (3) at least one of nitrogen, ammonia and hydrazine.

* * * * *